(12) United States Patent
Postnikov et al.

(10) Patent No.: US 7,879,727 B2
(45) Date of Patent: Feb. 1, 2011

(54) METHOD OF FABRICATING A SEMICONDUCTOR DEVICE INCLUDING A PATTERN OF LINE SEGMENTS

(75) Inventors: Sergei Postnikov, Brussels (BE); Thomas Schulz, Heverlee (BE); Hans-Joachim Barth, Munich (DE); Klaus von Arnim, Herzhorn (DE)

(73) Assignee: Infineon Technologies AG, Neubiberg (DE)

( * ) Notice: Subject to any disclaimer, the term of this patent is extended or adjusted under 35 U.S.C. 154(b) by 128 days.

(21) Appl. No.: 12/354,480

(22) Filed: Jan. 15, 2009

(65) Prior Publication Data

US 2010/0176479 A1 Jul. 15, 2010

(51) Int. Cl.
*H01L 21/311* (2006.01)
(52) U.S. Cl. .................. 438/700; 438/421; 438/689; 257/E21.546; 257/E29.17
(58) Field of Classification Search .................. 257/288, 257/E21.546, E29.17; 438/700, 421, 689
See application file for complete search history.

(56) References Cited

U.S. PATENT DOCUMENTS

| 6,642,148 | B1 | 11/2003 | Ghandehari et al. |
| 6,660,459 | B2 | 12/2003 | Babcock |
| 6,849,530 | B2 | 2/2005 | Bonser et al. |
| 6,924,068 | B2 | 8/2005 | Ohnuma |
| 7,122,296 | B2 | 10/2006 | Sabnis et al. |
| 7,166,533 | B2 | 1/2007 | Happ |
| 7,268,066 | B2 | 9/2007 | Bonser et al. |
| 7,366,620 | B2 | 4/2008 | Yamaguchi et al. |
| 7,449,230 | B2 | 11/2008 | Sabnis et al. |
| 2005/0020019 | A1 | 1/2005 | Bonser et al. |
| 2005/0208770 | A1* | 9/2005 | Chiba et al. .................. 438/700 |
| 2006/0148243 | A1* | 7/2006 | Wang .......................... 438/638 |
| 2007/0224825 | A1* | 9/2007 | Xiao et al. ................... 438/700 |
| 2008/0206985 | A1* | 8/2008 | Kim et al. .................... 438/637 |
| 2009/0142931 | A1* | 6/2009 | Wang et al. .................. 438/734 |
| 2009/0191711 | A1* | 7/2009 | Rui et al. ..................... 438/695 |
| 2010/0178771 | A1* | 7/2010 | Oh et al. ...................... 438/700 |

* cited by examiner

*Primary Examiner*—Thanh V Pham
*Assistant Examiner*—Duy T Nguyen
(74) *Attorney, Agent, or Firm*—Dicke, Billig & Czaja, PLLC

(57) ABSTRACT

A method of fabricating a semiconductor device including depositing a hardmask layer on a layer of the semiconductor device, selectively etching a pattern of continuous lines in the hardmask layer, depositing an antireflective coating over remaining portions of the hardmask layer, depositing a photoresist layer on the antireflective coating, patterning the photoresist layer with a plurality of isolation trenches via a lithography process, each of the isolation trenches extending perpendicular to and crossing portions of at least one of the continuous lines of the underlying hardmask layer, and with each isolation trench having an initial width. The method further includes reducing the width of each of the isolation trenches from the initial width to desired width via a shrinking process, etching the antireflective coating underlying the isolation trenches to expose intersecting portions of the underlying continuous lines, and etching the exposed intersecting portions of the underlying continuous lines of the hardmask layer to form a pattern of line segments having line ends separated by the desired width.

16 Claims, 13 Drawing Sheets

A-A

METHOD OF FABRICATING A SEMICONDUCTOR DEVICE INCLUDING A PATTERN OF LINE SEGMENTS

BACKGROUND

In the manufacture of semiconductor devices, such as static random access memory (SRAM) devices, for example, optical lithography processes are generally employed in the formation of poly lines or gate lines (PC lines) in a polysilicon layer (or metal gate stack) which, when positioned over active regions of an underlying silicon substrate, serve as MOS transistor gates. However, optical lithography processes suffer from shortcomings (e.g. distortion of mask patterns due to light diffraction) which cause corner rounding and line-end shortening of poly lines and results in gap distances between line ends to be greater than designed. In attempts to avoid such undesirable results, optical proximity correction (OPC) is employed to compensate for diffraction and other process errors. For example, one technique to compensate for line-end shortening, line ends are extended in the optical mask which results in a poly line lengths being closer to the intended design layout. However, such line extension beyond the active areas necessitates an undesirable increase in the area required for a memory cell.

One technique employed to prevent line-end shortening and achieve small line end gaps or tip-to-tip distances without the drawbacks of line-end extension is "double patterning." According to one double patterning technique, two separate exposures of a same photoresist layer using two different photomasks are employed. The first mask and exposure forms a pattern of poly lines in the photoresist layer in a first direction (e.g. vertical direction), while the second mask and exposure forms a plurality of small isolation segments or trenches in the photoresist layer which are perpendicular to the first direction (e.g. horizontal direction), each of which intersects at least one poly line of the pattern so as to form two line ends and the gap therebetween. According to one embodiment, the resulting pattern is etched into the polysilicon layer to form the desired poly line design.

While such double patterning techniques are work well for 45 nm node technology (i.e. the average half-pitch of a memory cell is 45 nm), the lithographic process window is nearly unmanageable for 32 nm node technology, and printing isolation segments or trenches on the order of 30 nm for 22 nm node technology with sufficient lithogrpahic process margins is not possible with 1.35 NA (numerical aperture) immersion lithography.

For these and other reasons, there is a need for the present invention.

SUMMARY

One embodiment provides a method of fabricating a semiconductor device. The method includes depositing a hardmask layer on a layer of the semiconductor device, selectively etching a pattern of continuous lines in the hardmask layer, depositing an antireflective coating over remaining portions of the hardmask layer, depositing a photoresist layer on the antireflective coating, patterning the photoresist layer with a plurality of isolation trenches via a lithography process, each of the isolation trenches extending perpendicular to and crossing portions of at least one of the continuous lines of the underlying hardmask layer, and with each isolation trench having an initial width. The method further includes reducing the width of each of the isolation trenches from the initial width to desired width via a shrinking process, etching the antireflective coating underlying the isolation trenches to expose intersecting portions of the underlying continuous lines, and etching the exposed intersecting portions of the underlying continuous lines of the hardmask layer to form a pattern of line segments having line ends separated by the desired width.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. It is to be understood that the features of the various exemplary embodiments described herein may be combined with each other, unless specifically noted otherwise. The following detailed description, therefore, is not to be taken in a limiting sense, and the scope of the present invention is defined by the appended claims.

According to one embodiment, the present disclosure provides a method of patterning gaps between lines of a semiconductor device, such as poly lines in a polysilicon layer of a memory device, such as an SRAM memory device, wherein the gaps have dimensions smaller than that obtainable using conventional lithography processes, including known double-patterning techniques.

FIGS. 1 through 12B below illustrate a method of patterning poly lines in a polysilicon layer of an SRAM device which enables patterning of line-end gaps at least on the order of 30 nm for 22 nm node technology, according to one embodiment. According to one embodiment, the process begins with a wafer 30, a portion of which is illustrated in a cross-sectional view in FIG. 1, and which includes a silicon substrate 32 having active areas (i.e. doped areas) defined therein, and a polysilicon layer 34 deposited thereon. In one embodiment, wafer 30 includes a metal layer 36 deposited on an inactive rear surface. In other embodiments, wafer 30 may include a metal gate stack in lieu of polysilicon layer 34.

Figure 2A:
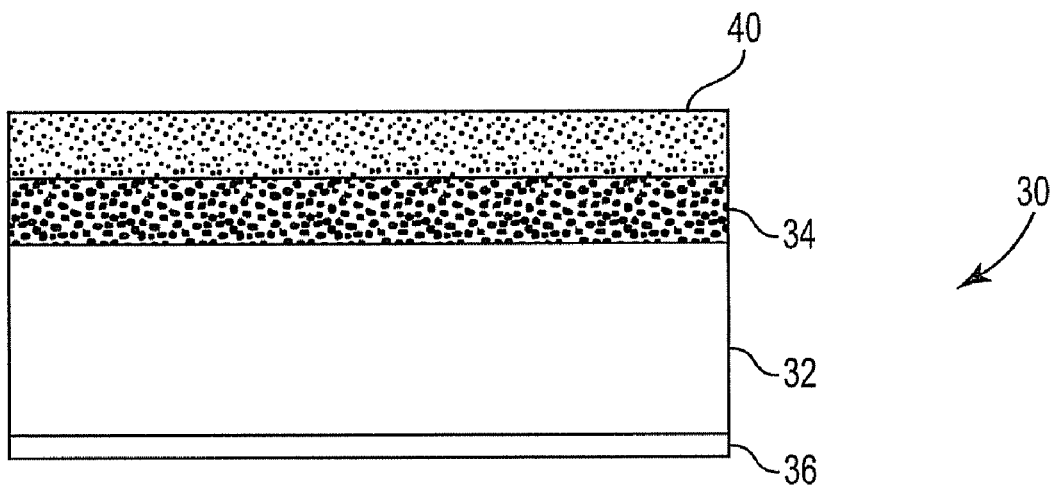
FIG. 2A illustrates the semiconductor wafer of FIG. 1 after deposition of a hardmask layer.
Figure 2B:
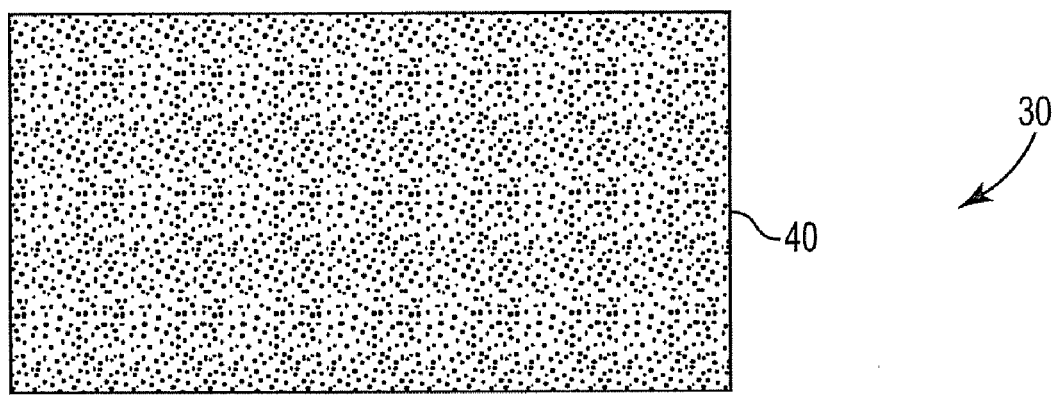
FIG. 2B is a top view of the semiconductor wafer of FIG. 2A.

As illustrated by FIG. 2A, a hardmask 40 is disposed on polysilicon layer 34. According to one embodiment, hardmask 40 is a strippable hardmask comprising Advanced Patterning Film (APF®) material deposited on polysilicon layer 34. APF® is produced by Applied Materials, Inc., and comprises an amorphous carbon layer and an SiOC layer (silicon oxycarbide). However, other suitable materials may be employed for hardmask 40 as well, such as SiC (silcon carbide) and SiCN (silicon carbide nitride), for example. In one embodiment, hardmask 40 is deposited using chemical vapor deposition (CVD) processes. FIG. 2B is a top view of wafer 30 illustrating hardmask 40.

Figure 3A:
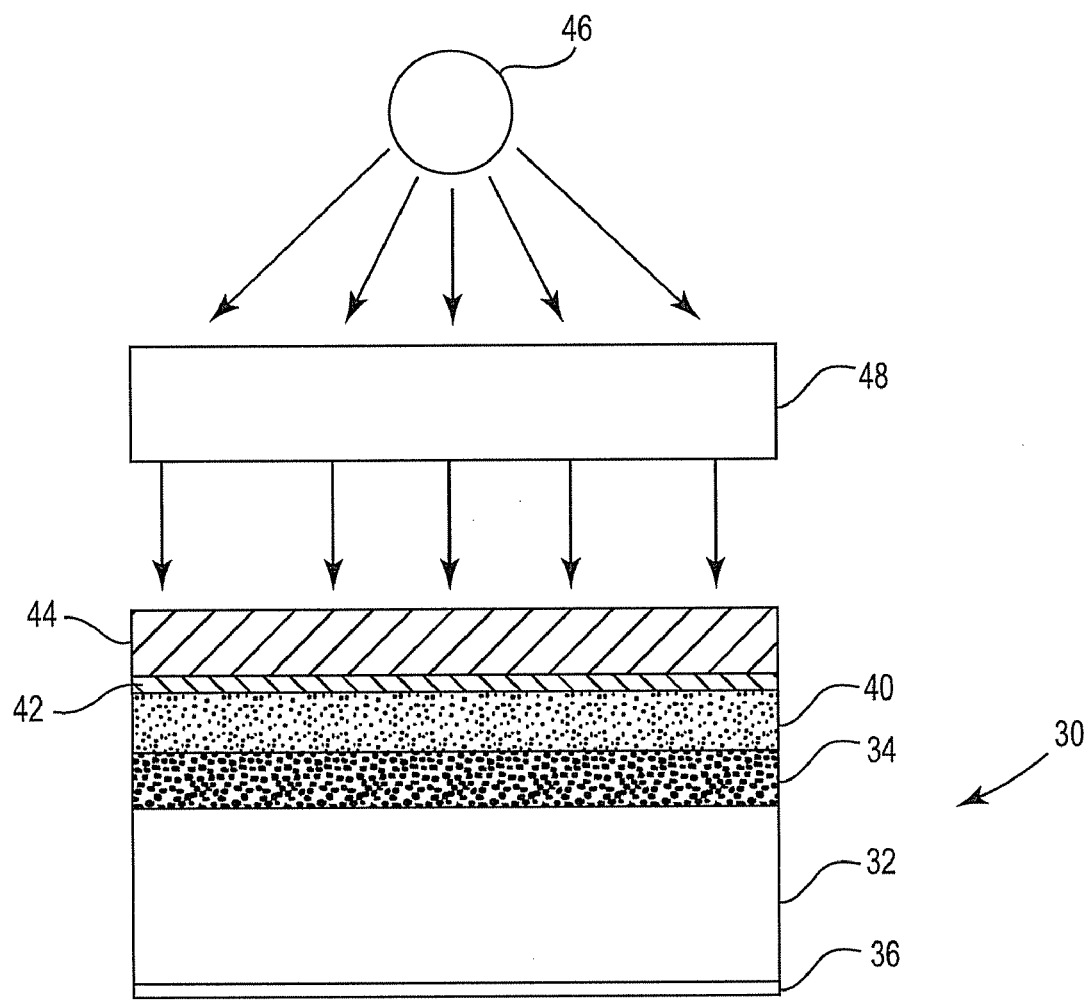
FIG. 3A illustrates the semiconductor wafer of FIG. 2A after deposition of first antireflective and photoresist layers.
Figure 3B:
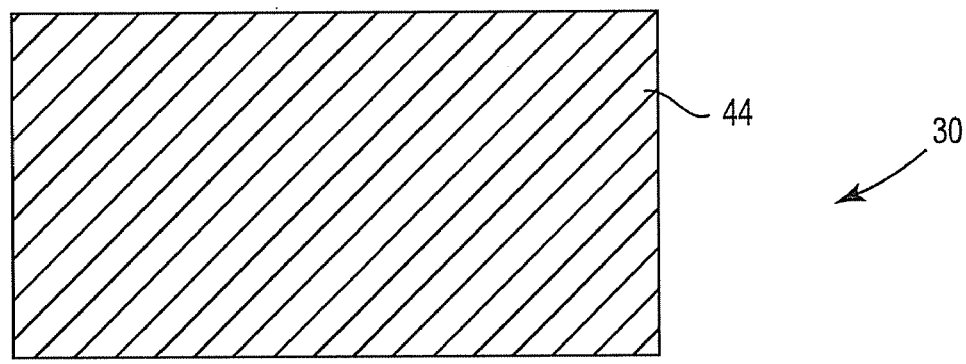
FIG. 3B is a top view of the semiconductor wafer of FIG. 3A.

As illustrated by FIG. 3A, a BARC (bottom anti-reflective coating) layer 42 and a photoresist layer 44 are deposited on hardmask 40. FIG. 3B is a top view of wafer 30 after deposition of BARC and photoresist layers 42 and 44. According to one embodiment, BARC layer 42 comprises a thin film or layer of SiON (silicon oxynitride) and is configured to suppress interference and/or standing waves produced by underlying layers during the photolithographic patterning of photoresist layer 44. A wide variety of photoresist materials may be used for photoresist layer 44. As illustrated by the Figures herein, photoresist layer 44 comprises a positive photoresist material (i.e. the photoresist that is exposed becomes soluble to photoresist developer). However, processes according to embodiments described herein may be readily adapted to employ negative photoresist material as well. According to one embodiment, BARC and photoresist layers 42 and 44 are applied using spin-coating techniques. According to one embodiment, BARC layer 42 is applied using CVD processes.

As further illustrated by FIG. 3A, after application of photoresist layer 44 over BARC layer 42, photoresist layer 44 is imagewise exposed to a radiation source 46 via a first mask 48 so as to form a desired first pattern of lines in photoresist layer 44. According to one embodiment, the desired first pattern of lines comprises a pattern of continuous lines extending in a first direction (e.g. a vertical direction) in photoresist layer 44. It is noted that other means for selectively exposing photoresist layer 44 to radiation to form the desired image pattern may also be used.

Figure 4A:
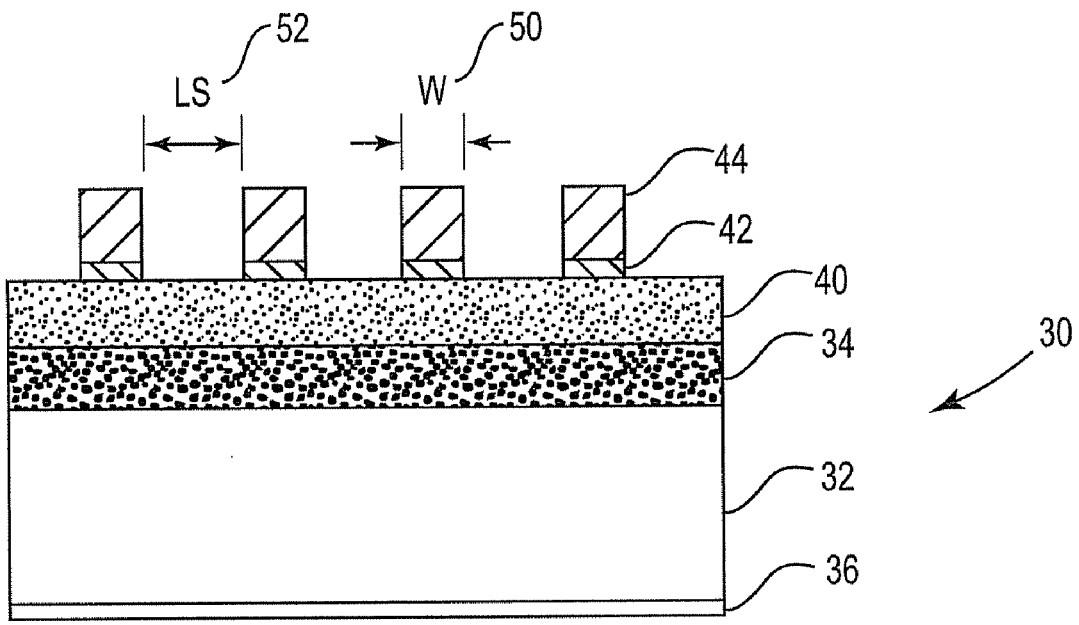
FIG. 4A illustrates the semiconductor wafer of FIG. 3A after patterning of the first photoresist and of the antireflective layers.
Figure 4B:
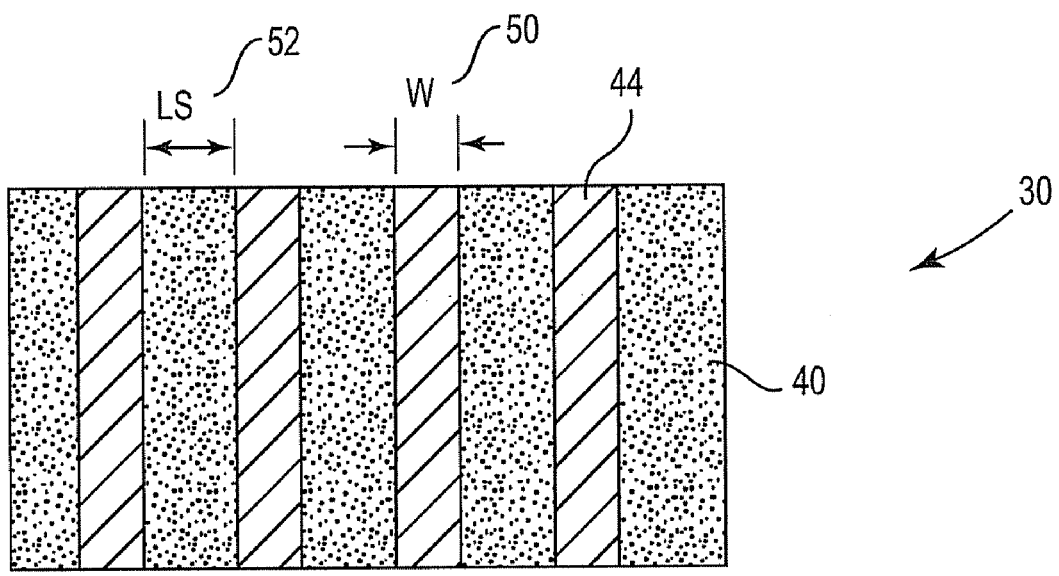
FIG. 4B is a top view of the semiconductor wafer of FIG. 4A.

With reference to FIGS. 4A and 4B, photoresist layer 44 is developed, such as by using a photoresist developer or solvent, so that exposed portions of photoresist layer 44 are removed (in the case of positive photoresist material). The remaining portions of photoresist layer 44 represent portions of a desired poly line pattern (e.g. poly gate lines) to ultimately be transferred to polysilicon layer 34 such that each of the remaining portions of photoresist layer 44 have a width equal to a desired width of a corresponding poly line, such as an example width W as indicated at 50, and a desired line spacing there between, such as an example line spacing LS as indicated at 52.

The exposed portions of underlying BARC layer 42, in the spaces between the remaining portions of photoresist layer 44, are then removed so as to expose underlying portions of hardmask 40. According to one embodiment, the exposed portions of BARC layer 42 are removed using suitable etching processes (e.g. dry etching processes, such as plasma etching, including reactive ion etching), wherein the particular etching processes employed may vary depending on the type of material used for BARC layer 42. In any case, the etching process is configured so as to be highly selective to the material of underlying hardmask 40. FIGS. 4A and 4B illustrate wafer 30 after selective removal of the exposed portions of photoresist layer 44 and BARC layer 42.

Figure 5A:
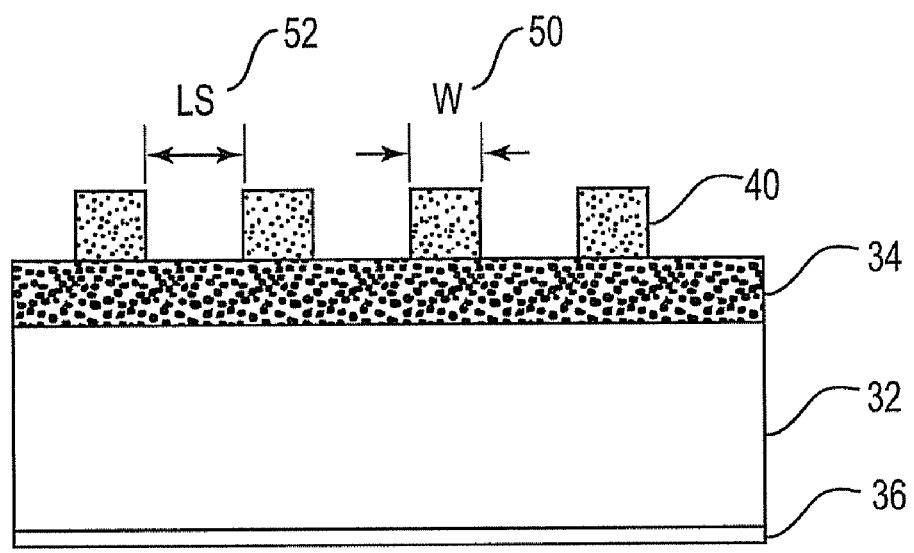
FIG. 5A illustrates the semiconductor wafer of FIG. 4A after patterning of the hardmask layer and removal of the first photoresist and antireflective layers.
Figure 5B:
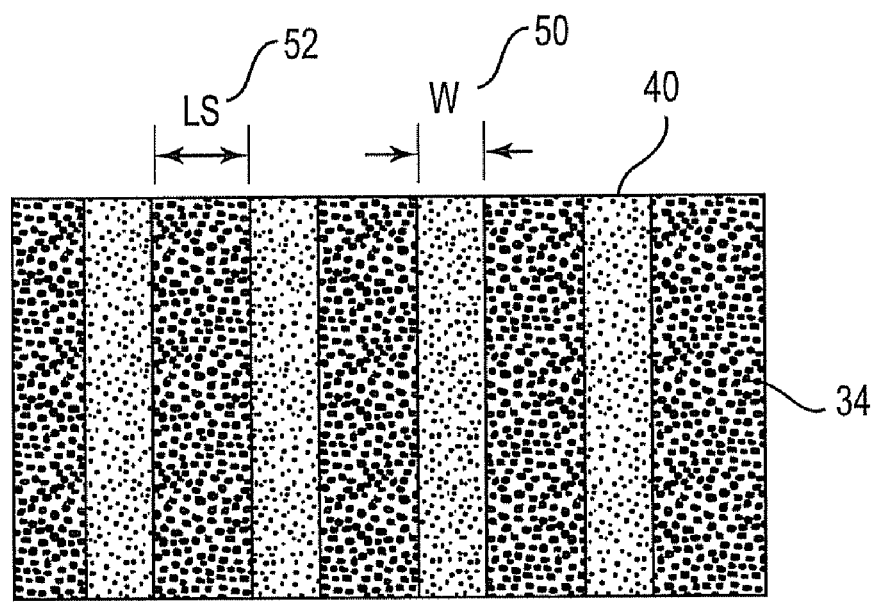
FIG. 5B is top view of the semiconductor wafer of FIG. 5A.

As illustrated by FIGS. 5A and 5B, the exposed portions of hardmask 40 are then removed via etching processes. As with the etching of BARC layer 42, the etching process is highly selective so as to not affect underlying polysilicon layer 34. The remaining portions of BARC layer 42 and photoresist layer 44 are then stripped, leaving only portions of hardmask 40 corresponding to the desired vertical pattern of lines to be transferred to polysilicon layer 34. As such, each of the remaining portions of hardmask 40 have a width equal to a desired width of the corresponding poly line, such as example width W 50 and a desired line spacing there between, such as example line spacing LS 52.

Figure 6A:
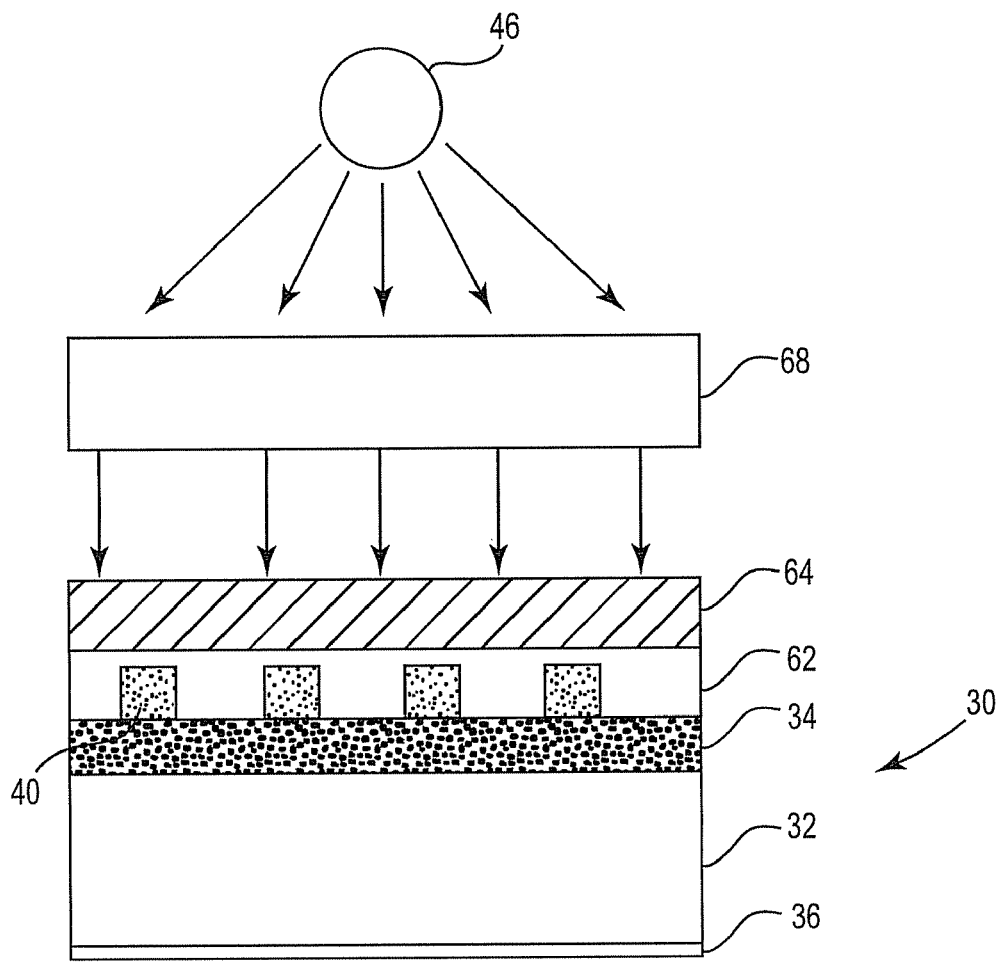
FIG. 6A illustrates the semiconductor wafer of FIG. 5A after deposition of second antireflective and photoresist layers.
Figure 6B:
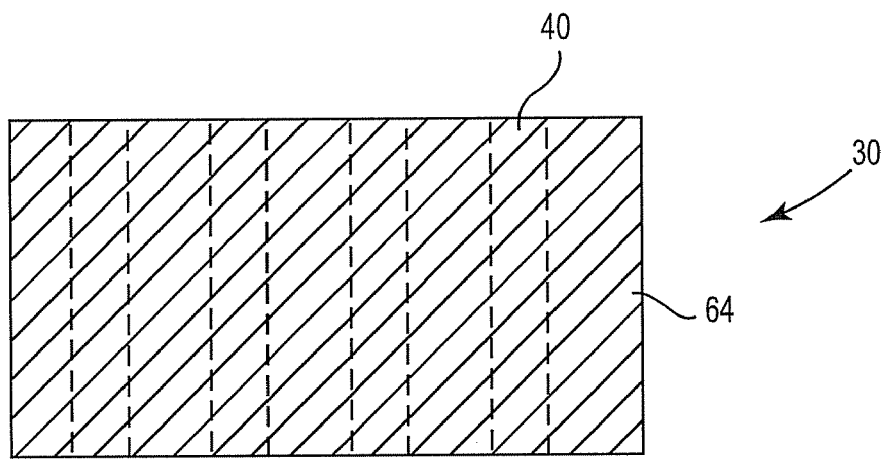
FIG. 6B is a top view of the semiconductor wafer of FIG. 6A.

With reference to FIGS. 6A and 6B, a second BARC layer 62 is next deposited over the remaining portion of hardmask 40, such as via spin-coating or CVD techniques. According to one embodiment, BARC layer 62 is highly planarized so as to substantially reduce or eliminate potentially adverse effects that the underlying topography of etched hardmask 40 may have on subsequent lithography procedures. A second photoresist layer 64 is then disposed on BARC layer 62.

Subsequently, a second exposure of wafer 30 is performed such that photoresist layer 64 is imagewise exposed to radiation source 46 via a second mask 68 so as to form a desired second pattern of lines in photoresist layer 64. According to one embodiment, the desired second pattern of lines comprises a pattern of short line segments extending in a second direction in photoresist layer 44, opposite the direction of the lines of mask 48 (e.g. a horizontal direction), with each of the short line segments of the second pattern configured to intersect one or more of the vertical poly lines of first mask 48. FIG. 6B is a top view of wafer 30 illustrating, in dashed lines, the remaining portions of hardmask 40 underlying BARC and photoresist layers 62 and 64 and extending in a vertical direction across wafer 30.

Figure 7:
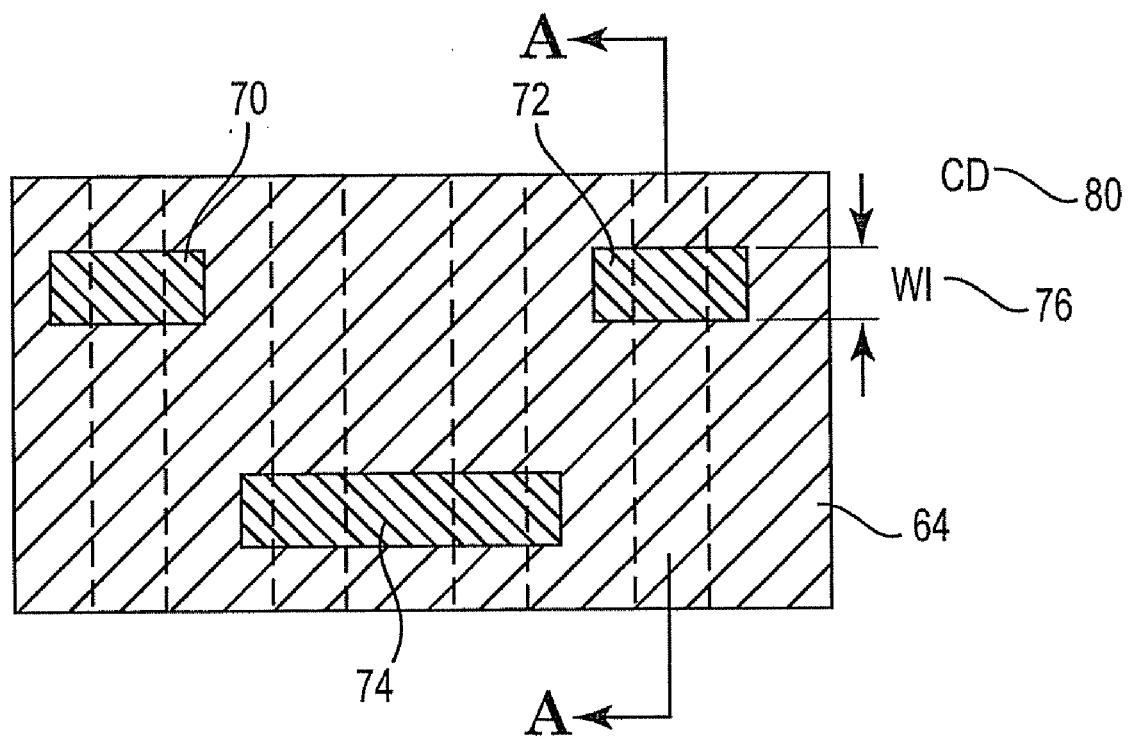
FIG. 7 is a top view of the semiconductor wafer of FIG. 6B after patterning trenches in the second photoresist layer.

With reference to FIG. 7, which is a top view of wafer 30, after exposure to radiation source 46, photoresist layer 64 is developed to remove the exposed portions to thereby form horizontal line segments or isolation trenches in photoresist layer 64, such as isolation trenches 70, 72, and 74.

As will be described in greater detail below, isolation trenches 70, 72, and 74 will be employed to form line ends or gaps of a desired width or line end spacing between poly lines formed by the continuous lines of the first pattern in polysilicon layer 34. However, as initially formed via development and etching of photoresist layer 64 and BARC layer 62, each of the isolation trenches 70, 72, and 74 has a width, such as width W1 as indicated at 76, which is greater than a design spacing or critical dimension (CD) between line ends of poly lines to ultimately be formed in polysilicon layer 34.

Figure 8:
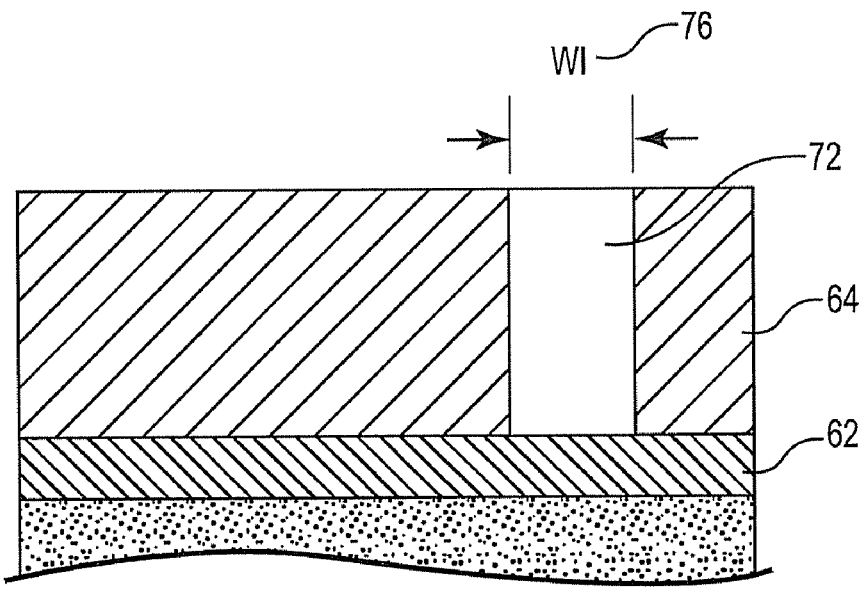
FIG. 8 is a cross section of the semiconductor wafer of FIG. 7 illustrating a trench at an initial width.

FIG. 8 is a cross-sectional view A-A of isolation trench 72 of FIG. 7 after removal of the exposed portions of photoresist layer 40. As illustrated, isolation trench 72 has a width W1 76, which is greater than the desired spacing between line ends of poly lines to ultimately be formed in polysilicon layer 34.

Figure 9:
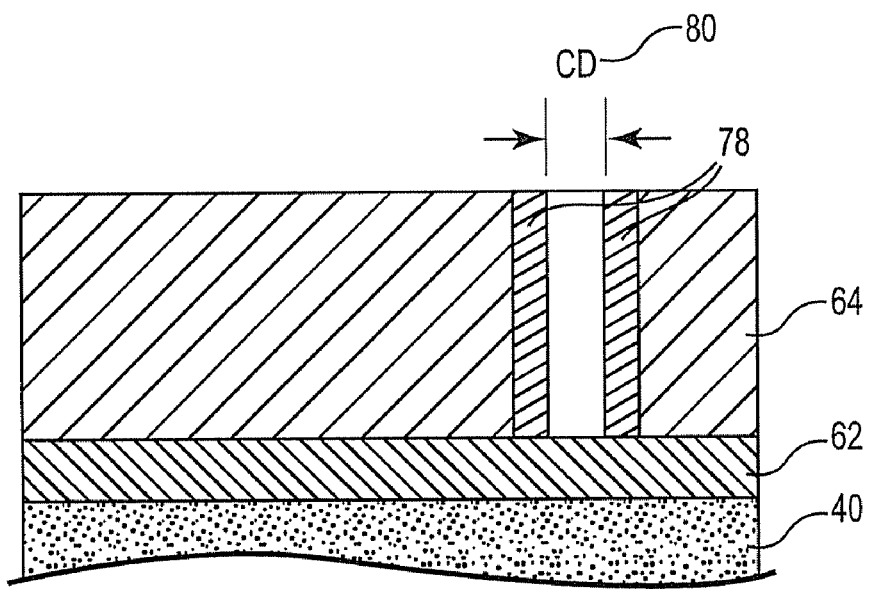
FIG. 9 is a cross section of the semiconductor wafer of FIG. 8 illustrating the trench at a reduced width after shrinking.

With reference to FIG. 9, a shrink technique is then applied to form or grow a layer of coating material 78 within isolation trench 72 so as to "shrink" the width of trench 72 from width W1 76 to the desired CD 80. According to one embodiment, the coating material comprises a polymer material. According to one embodiment, the shrink technique comprises a plasma-assisted polymer deposition shrink technique, such as the Motif™ plasma-assisted CD shrink technique. According to such a technique, a recipe is developed such that an experimentally known amount or depth of coating material 78 is applied with each deposition cycle. The deposition cycle is then repeated as many times as necessary to apply a depth of coating material required to shrink the width of horizontal trench 72 from width W1 76 to CD 80.

For example, in a scenario where width W1 76 is 60 nm and a deposition recipe deposits a combined depth of 1 nm of coating material 78 is deposited on opposing walls of isolation trench 72 with each deposition cycle (0.5 nm per side wall per cycle), a total of 30 deposition cycles would be employed to shrink the width of trench 72 from 60 nm to a desired CD of 30 nm. Other suitable shrink techniques may also be employed to apply or grow the layer of coating material 78, such as RELACS techniques (Resolution Enhancement Lithography Assisted by Chemical Shrink), for example.

Figure 10:
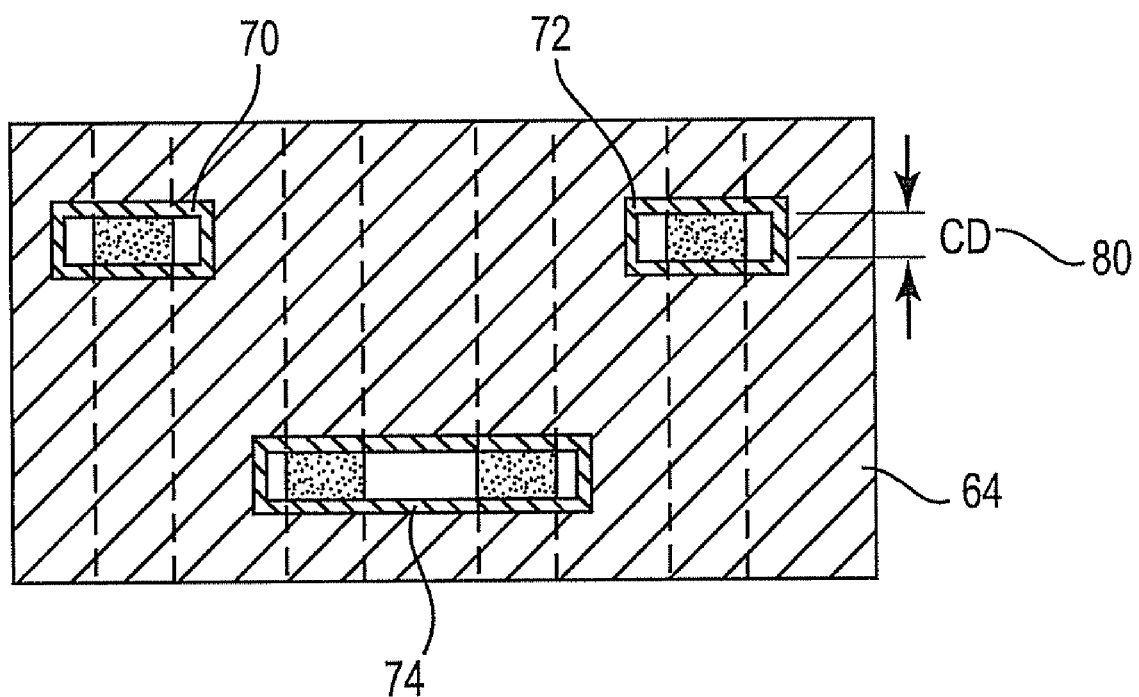
FIG. 10 is a top view of the semiconductor wafer of FIG. 7 after patterning trenches in the antireflective coating.

With reference to FIG. 10, the portions of underlying BARC layer 62 exposed by isolation trenches 70, 72, and 74 are etched, in fashions similar to that described above with respect to FIGS. 4A and 4B, to expose the portions of the vertical lines formed in underlying hardmask 40 which intersect isolation trenches 70, 72, and 74.

Figure 11A:
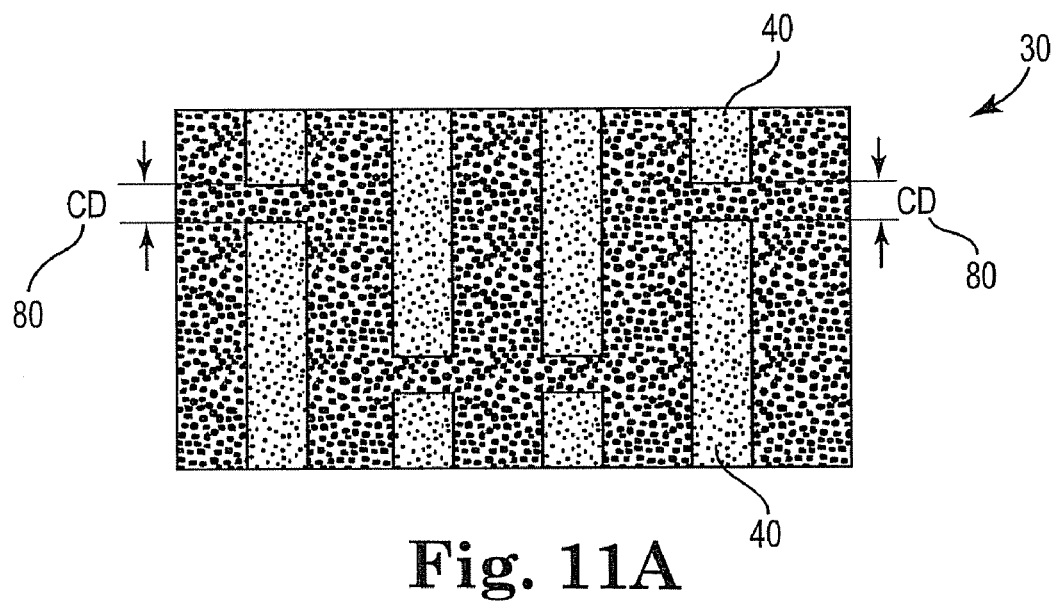
FIG. 11A is a cross section of the semiconductor wafer of FIG. 9 after patterning of the trenches into the hardmask layer and removal of the second photoresist and antireflective layers.
Figure 11B:
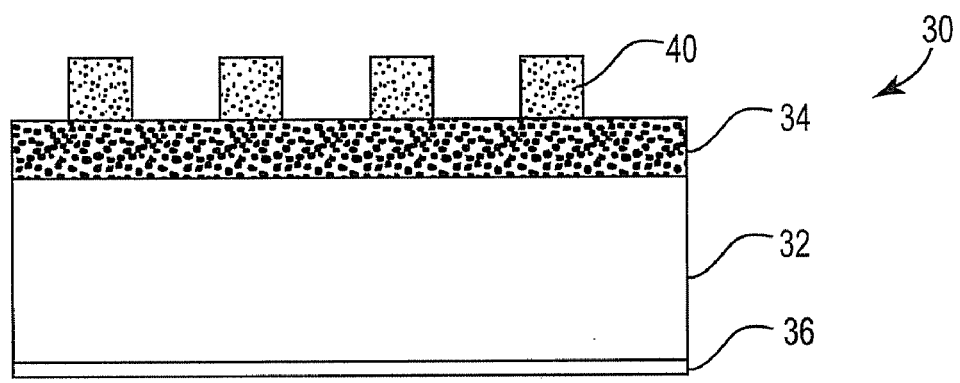
FIG. 11B is a top view of the semiconductor wafer of FIG. 10A.

With reference to FIGS. 11A and 11B, after the critical dimension, such as CD 80, has been achieved for isolation trenches 70, 72, and 74, the exposed portions of hardmask 40 are removed via an etching process, such as described above with respect to FIGS. 5A and 5B. The remaining portions of BARC layer 62 and photoresist layer 64 are then stripped leaving only portions of hardmask 40 corresponding to the complete line pattern (including the gaps between lines formed by horizontal trenches 70, 72, and 74) desired to be transferred to polysilicon layer 34. As illustrated by FIG. 11A, the line ends of the resulting desired line pattern in hardmask 40 are separated by CD 80.

Figure 12A:
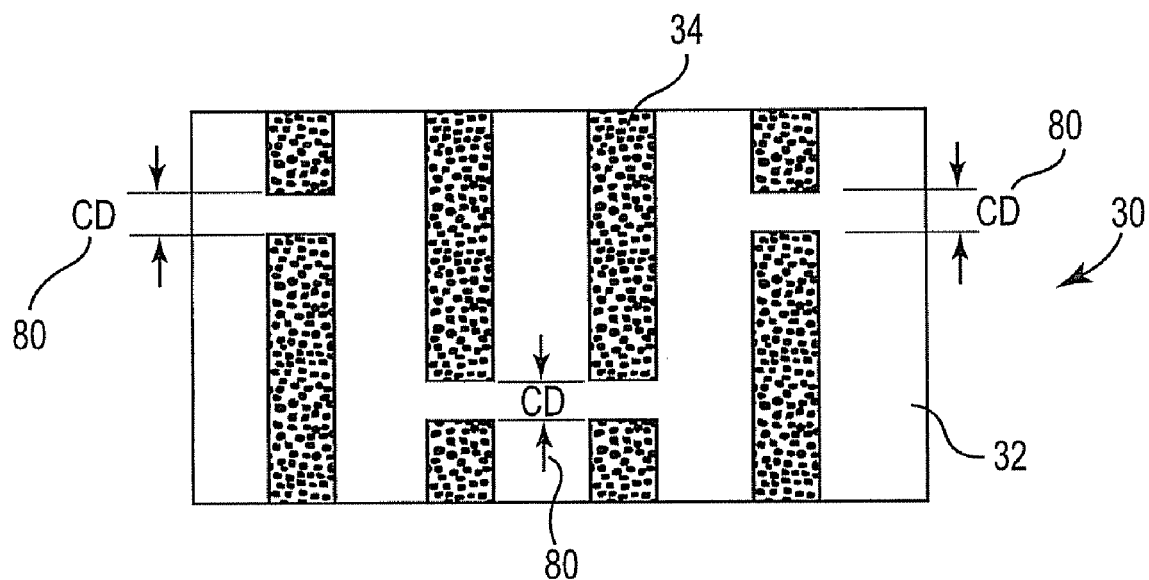
FIG. 12A is a top view of the semiconductor wafer of FIG. 10A after patterning the gate layer with the hardmask pattern of FIG. 10B and removal of the hardmask layer.
Figure 12B:
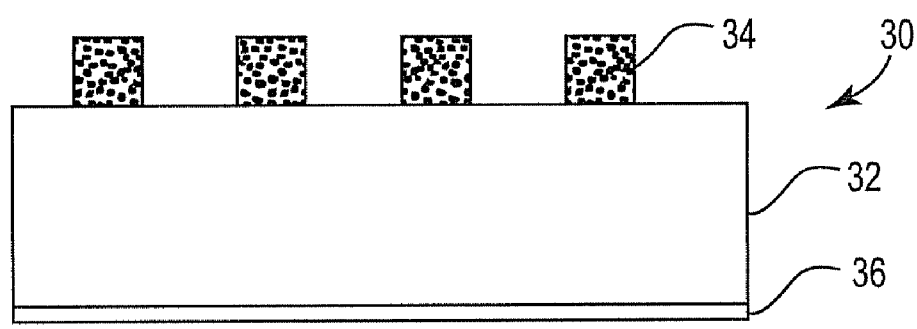
FIG. 12B is cross section of the semiconductor wafer of FIG. 11A.

With reference to FIGS. 12A and 12B, the line pattern of hardmask 40 is then used as an etch mask to transfer the desired line pattern to polysilicon layer 34. According to one embodiment, the etching process comprises a plasma etch process employing a SF6/CH2F2/N2/He chemistry, for example. However, any number of suitable etching processes may be employed. After etching the exposed portions of polysilicon layer 34, the remaining portions of hardmask 40 are stripped, thereby leaving the desired poly line or gate line pattern in polysilicon layer 34. In the illustrated example of FIG. 12A, after etching, each of the line end gaps or line-end to line-end spacings has a dimension equal to the critical dimension CD 80.

By employing the second lithography exposure (which is de-coupled from the first lithography exposure which forms continuous poly lines) to form isolation trenches in the photoresist layer having widths greater than a desired critical dimension, and then shrinking the isolation trenches to the desired critical dimension prior to etching the isolation trenches into a hard mask to form gaps in and segment the continuous lines, smaller line end gaps can be achieved relative to forming line-end gaps using a single lithographic step or using conventional double patterning techniques. For example, line end gaps in the range of 35-40 nm can be readily achieved for 22 nm node technology, with smaller line end gaps also being achievable (e.g. 30 nm, 25 nm).

Additionally, by first forming the isolation trenches with a relatively large initial width, such as 60 nm or 50 nm, for example, such narrower final line-end gaps distances can be achieved while using a relaxed and manageable lithographic process window. Furthermore, by forming the line end gaps in the polysilicon layer (or other layer, such as a metal stack, for example) via etching with a hardmask, the line gaps distances are determined by the cut mask imaging rather than line-end shortening effects.

As mentioned above, by first forming horizontal isolation trenches in photoresist layer 64 which have a width greater than the critical dimension CD 80, a relatively relaxed and manageable lithographic process can be employed in the formation of line end gaps of sub-lithographic dimensions. A lithographic process window typically refers to the relationship between exposure latitude (EL) of the lithographic radiation source (i.e. the variation in the dose of radiation, mJ/cm$^2$) and in the depth of focus (DOF), which varies depending on the size of the feature being exposed. Generally, the smaller the feature size being imaged, the less the dose and the less the DOF may vary in order to produce a feature size which does not vary from the CD (critical dimension) by an allowable amount (e g. +/−10%).

Figure 13:
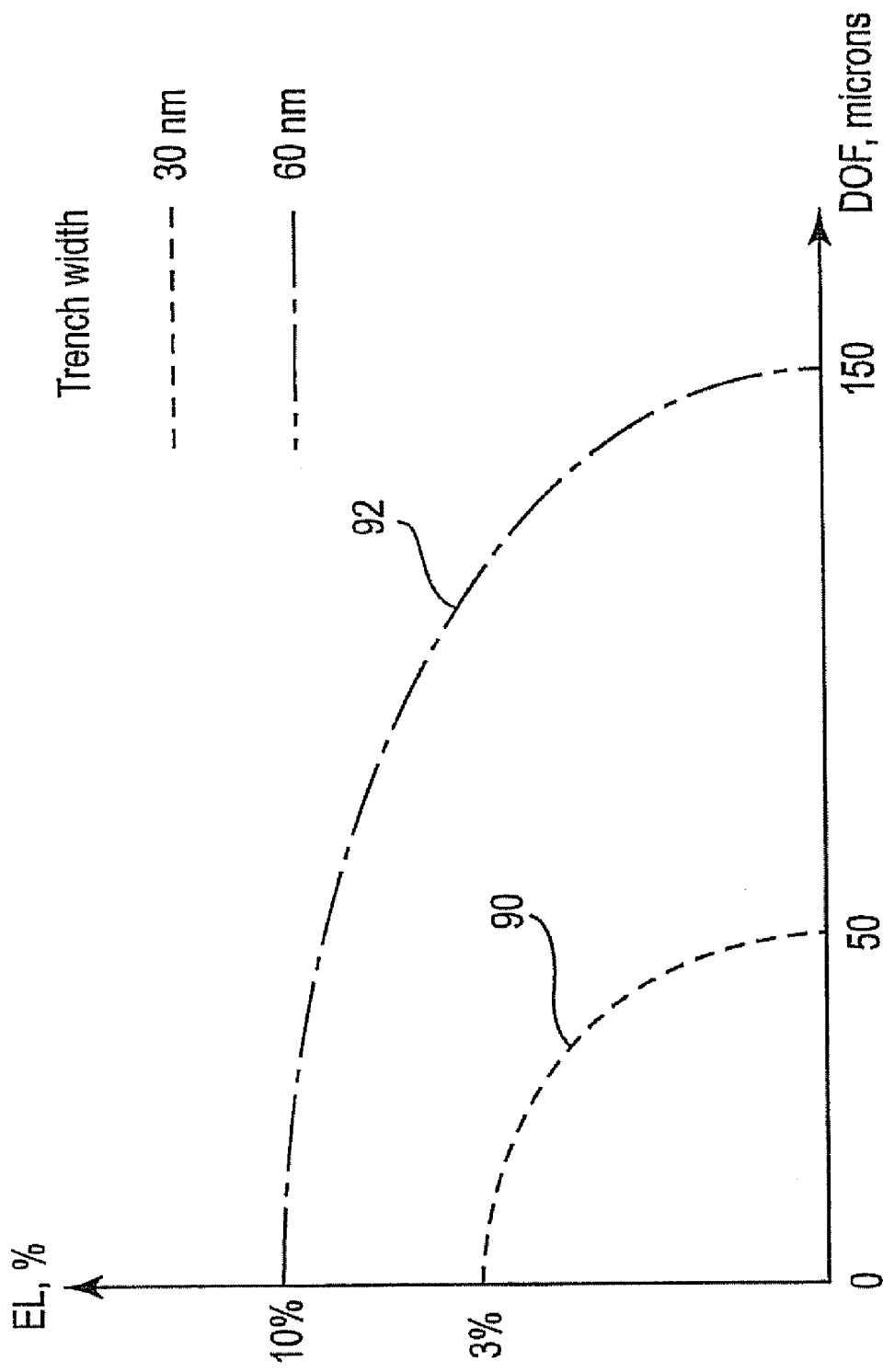
FIG. 13 is a graph illustrating example lithography process windows.

FIG. 13 is a graph illustrating of curves 90 and 92 which respectively represent the lithographic process windows for example trenches of 30 nm and 60 nm. In the example illustration, a 3% variation in exposure dose (i.e. the exposure latitude, EL) means that no variation in DOF is allowed when exposing a 30 nm trench, and that a 50 micron deviation in DOF means that no variation is allowed in the exposure dose. For example, if the source varies by only 2%, only about a 35 micron variation in DOF is allowed. Anything beyond these limits will result in a greater than allowed variation from the critical dimension of the 30 nm trench. Such tight process controls are extremely difficult, if not impossible, to achieve.

Conversely, for a 60 nm trench, the lithographic process window is much more relaxed, with 10% variation in exposure dose meaning that no variation in DOF is allowed and that a 150 micron variation in DOF meaning that no variation in exposure dose is allowed. In this case, for example, if the radiation source varies by 3%, approximately a 120 micron variation in DOF is allowed while still maintaining the CD of the trench within the allowable range. As such, FIG. 13 illustrates that a 60 nm trench can be accurately formed (i.e. will not vary from the CD by more than the allowable limit) and with more relaxed process controls relative to a 30 nm trench.

Based on the above, an initial width W1 76 of the isolation trenches 70, 72, and 74 formed in the second photoresist layer 64 is selected so as to be large enough to provide a relaxed and readily controllable lithographic process window (and, thus, enable accurate imaging of the trenches), but yet small enough so that the shrinking process can be completed within a reasonable number of cycles. For example, in one embodiment, an initial width W1 is selected which provides a lithographic process window similar to curve 92 of FIG. 13, which intersects the DOF axis at approximately 150 microns (i.e. a 60 nm trench).

Figure 1:
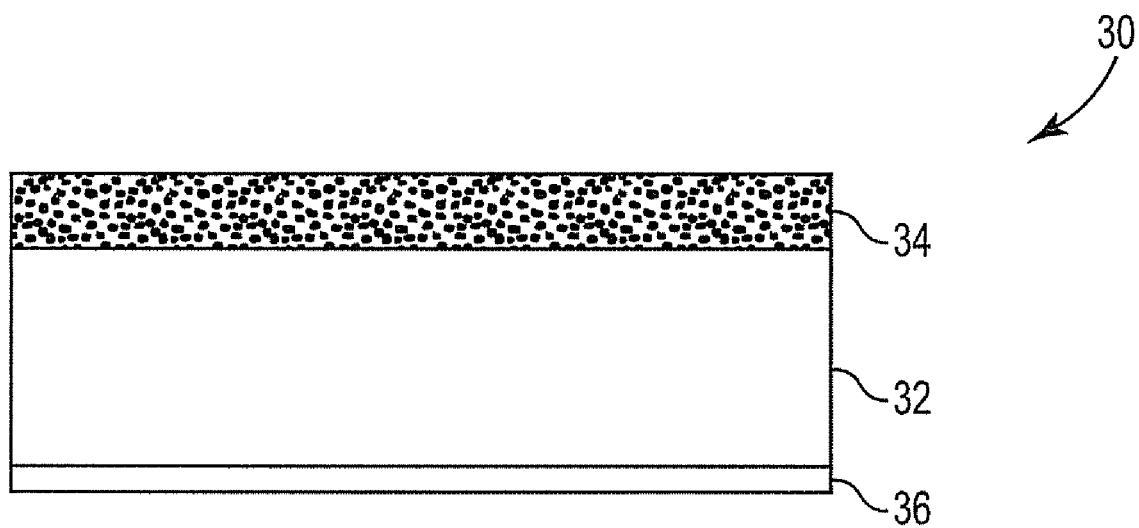
FIG. 1 is a cross-section of a portion of a semiconductor wafer having a gate layer.
Figure 14:
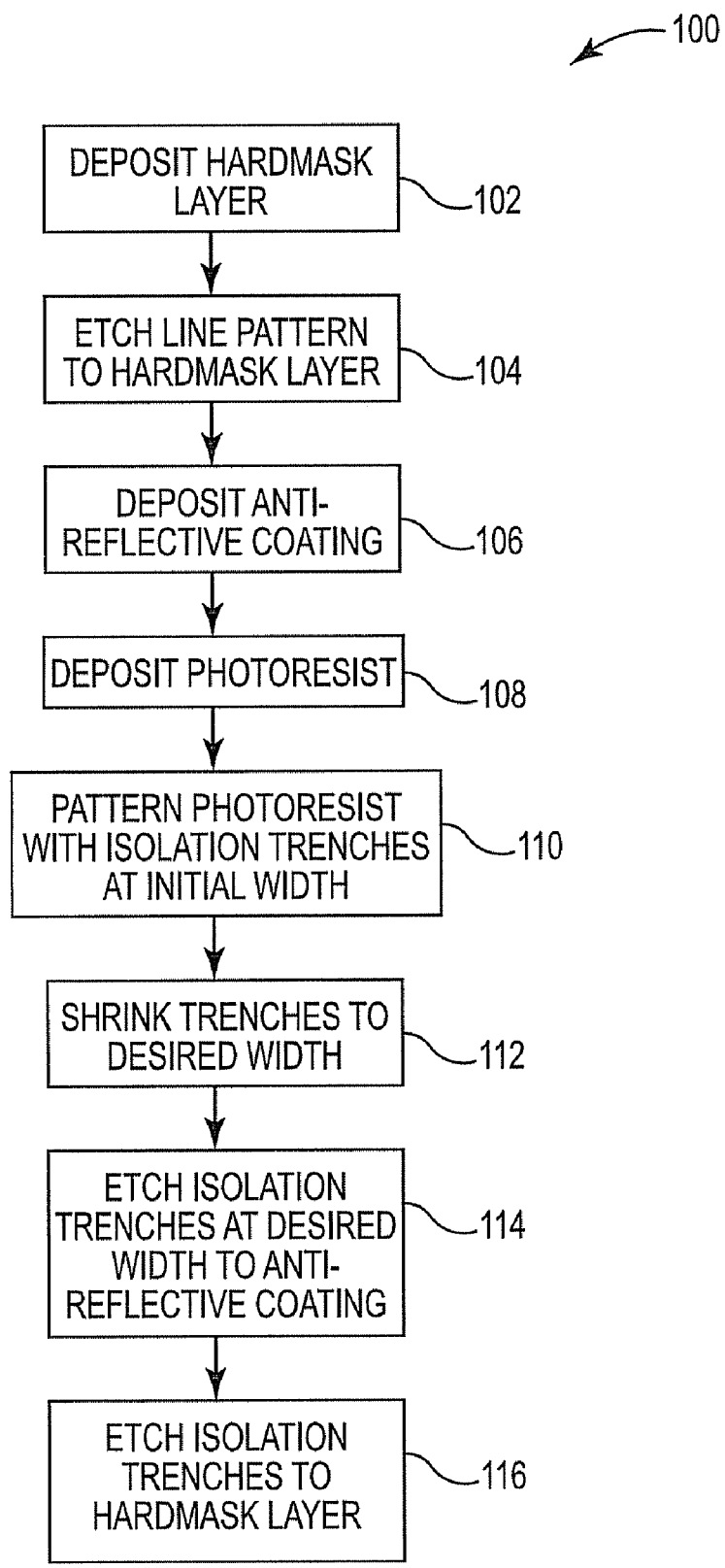
FIG. 14 is a flow diagram illustrating a method of fabrication a semiconductor device according to one embodiment.

FIG. 14, with reference to FIGS. 1 through 13 above, is a flow diagram generally illustrating a process 100 for patterning line end gaps according to one embodiment. Process 100 begins at 102 with depositing a hardmask layer on a layer of semiconductor device, such as a semiconductor wafer, as illustrated by FIG. 1. According to one embodiment, the layer on which the hardmask layer is deposited is a gate layer (e.g. a polysilicon layer) of a semiconductor memory device (e.g. SRAM device), such as described above with respect to FIGS. 2A and 2B. According to one embodiment, the hardmask layer comprises Advanced Patterning Film (APF™) and is deposited using CVD techniques.

At 104, a pattern of continuous lines is etched into the hardmask layer deposited at 102, such as described above by FIGS. 5A and 5B. According to one embodiment, the pattern of continuous lines comprises a plurality of continuous line extending in parallel with one another in substantially a first direction (with the exception of off-sets, for example). According to one embodiment, etching the pattern of continuous lines includes first depositing a bottom antireflective coating (BARC) on the hardmask layer, depositing a photoresist layer on the antireflective coating, and patterning the continuous lines into the photoresist layer and the antireflective coating using lithographic and etching processes, such as described above with respect to FIGS. 3A through 4B. According to one embodiment, such BARC and photoresist layers are applied using spin-coating techniques. In other embodiments, the BARC layer is applied using CVD techniques.

At 106, after the patterning of the hardmask layer at 104, a BARC coating or layer is deposited over the remaining portions of the hardmask layer (i.e. the continuous lines). According to one embodiment, the antireflective coating is highly planarized so as to prevent interference which may be caused by the topography of the patterned hardmask layer during subsequent lithograph processes. At 108, a photoresist layer is deposited on the antireflective coating deposited at 106.

At 110, the photoresist layer deposited at 108 is patterned, via lithography processes (including at least the exposure and development of the photoresist material), with a pattern of isolation trenches, with each of the isolation trenches extending perpendicular to and across at least a portion of at least one of the continuous lines in the underlying hardmask layer, and with each of the trenches having an initial width. According to one embodiment, the patterning process is similar to that described above with respect to FIGS. 6A, 6B, and 7.

At 112, the width of each of the isolation trenches in the photoresist layer is reduced from the initial width to a desired width, such as described above with respect to FIGS. 8 and 9. According to one embodiment, the initial width is a width large enough (e.g. 60 nanometers) to provide the lithography process with a large lithographic process window (see FIG. 13) so at to enable accurate formation or patterning of the isolation trenches. According to one embodiment, the desired width after shrinking is equal to a critical dimension of a line end spacing desired to be achieved in the underlying semiconductor layer (e.g. CD of line-end to line-end gap between gate lines). According to one embodiment, the shrinking process comprises RELACS™. According to one embodiment, the shrinking process comprises the Motif™ plasma-assisted CD shrink technique.

Process 100 then proceeds to 114, where the exposed portions of the underlying antireflective coating are removed by etching so as to expose portions of the continuous lines in the underlying hardmask layer which cross under the isolation trenches, such as illustrated by FIG. 10. At 116, the exposed portions of the underlying continuous lines of the hardmask layer are removed by etching to form gaps therein and form a pattern of lines segment having line ends separated by the desired width (i.e. the critical dimension). According to further embodiments, the remaining portions of the photoresist layer and antireflective coating are removed, as illustrated by FIGS. 11A and 11B, and the remaining mask pattern is etch transferred to the layer of the semiconductor device, as illustrated by FIGS. 12A and 1B.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of fabricating a semiconductor device comprising:
   depositing a hardmask layer on a layer of the semiconductor device;
   selectively etching a pattern of continuous lines in the hardmask layer;
   depositing an antireflective coating over remaining portions of the hardmask layer;
   depositing a photoresist layer on the antireflective coating;
   patterning the photoresist layer with a plurality of isolation trenches via a lithography process, each of the isolation trenches extending perpendicular to and crossing portions of at least one of the continuous lines of the underlying hardmask layer, with each isolation trench having an initial width;
   reducing the width of each of the isolation trenches from the initial width to desired width via a shrinking process;
   etching the antireflective coating underlying the isolation trenches to expose intersecting portions of the underlying continuous lines; and
   etching the exposed intersecting portions of the underlying continuous lines of the hardmask layer to form a pattern of line segments having line ends separated by the desired width.

2. The method of claim 1, including:
   removing the remaining portions of the photoresist layer;
   removing the remaining portions of the antireflective layer by etching;

etch transferring the pattern of line segments formed by remaining portions of the hardmask layer to the layer of the semiconductor device; and removing the remaining portions of the hardmask by etching.

3. The method of claim 2, wherein the layer of the semiconductor device comprises a gate layer and the pattern of line segments comprise gate lines.

4. The method of claim 3, wherein the gate layer comprises a polysilicon layer.

5. The method of claim 3, wherein the gate layer comprises a metal gate stack.

6. The method of claim 2, wherein etch transferring the pattern of line segments to the layer of the semiconductor device comprises a plasma etching process.

7. The method of claim 1, wherein the shrinking process includes growing a layer of polymer material on side walls of the isolation trenches using a Resolution Enhancement Lithography Assisted by Chemical Shrink (RELACS™) technique.

8. The method of claim 1, wherein shrinking the width of each isolation trench includes depositing a polymer material on walls of the isolation trenches via a Motif™ post-lithography plasma assist critical dimension shrink technique.

9. The method of claim 1, wherein the hardmask layer comprises Advanced Patterning Film (APF™).

10. The method of claim 1, wherein the antireflective coating comprises a highly planarized antireflective coating.

11. The method of claim 1, wherein selectively etching a pattern of continuous lines in the hardmask layer includes depositing a photoresist layer on the hardmask layer and patterning the photoresist layer with the pattern of continuous lines via a lithography process.

12. The method of claim 11, further including disposing an antireflective coating between the hardmask layer and the photoresist layer.

13. The method of claim 1, wherein the initial width is of a dimension that enables the lithography process used to pattern the photoresist layer to employ a lithography process window having an exposure latitude in a range from 8-10% and a depth-of-focus in a range from 140-180.

14. The method of claim 1, wherein the initial width is at least 50 nanometers.

15. The method of claim 1, wherein the desired width comprises a sub-lithographic dimension.

16. The method of claim 15, wherein the desired width is not greater than 40 nanometers.

* * * * *